(12) United States Patent
Strouse et al.

(10) Patent No.: US 6,740,544 B2
(45) Date of Patent: May 25, 2004

(54) SOLDER COMPOSITIONS FOR ATTACHING A DIE TO A SUBSTRATE

(75) Inventors: Floyd Strouse, Tempe, AZ (US); Lori D. Carroll Shearer, Scottsdale, AZ (US); Brant Besser, Mesa, AZ (US)

(73) Assignee: Freescale Semiconductor, Inc., Schaumburg, IL (US)

( * ) Notice: Subject to any disclaimer, the term of this patent is extended or adjusted under 35 U.S.C. 154(b) by 0 days.

(21) Appl. No.: 10/145,503

(22) Filed: May 14, 2002

(65) Prior Publication Data

US 2003/0215981 A1 Nov. 20, 2003

(51) Int. Cl.$^7$ ............................................. H01L 21/44
(52) U.S. Cl. ........................ 438/118; 257/772; 420/555
(58) Field of Search ........................ 438/107–110, 118; 257/779, 703, 772, 782, 723–725, 783; 420/555; 228/112.1; 148/402

(56) References Cited

U.S. PATENT DOCUMENTS

| | | | | |
|---|---|---|---|---|
| 3,141,238 A | * | 7/1964 | Harman | 228/248.1 |
| 3,462,573 A | * | 8/1969 | Rabinowitz | 335/51 |
| 4,659,384 A | * | 4/1987 | Daigo et al. | 106/35 |
| 5,053,195 A | * | 10/1991 | MacKay | 420/555 |
| 5,097,387 A | | 3/1992 | Griffith | 361/385 |
| 5,170,930 A | * | 12/1992 | Dolbear et al. | 228/123.1 |
| 5,173,256 A | * | 12/1992 | Booth et al. | 420/590 |
| 5,198,189 A | * | 3/1993 | Booth et al. | 420/555 |
| 5,221,038 A | | 6/1993 | Melton et al. | 228/180.2 |
| 5,225,157 A | * | 7/1993 | McKay | 420/525 |
| 5,391,846 A | * | 2/1995 | Taylor et al. | 200/233 |
| 5,417,362 A | * | 5/1995 | Chiyonobu et al. | 228/180.1 |
| 5,419,806 A | * | 5/1995 | Huebner | 216/20 |
| 5,429,292 A | * | 7/1995 | Melton et al. | 228/180.22 |
| 5,478,978 A | * | 12/1995 | Taylor et al. | 200/233 |
| 5,502,002 A | * | 3/1996 | Wong et al. | 438/605 |

(List continued on next page.)

FOREIGN PATENT DOCUMENTS

| | | | |
|---|---|---|---|
| DE | 195 31 158 A1 | 2/1997 | |
| DE | 195 32 250 A1 | 3/1997 | |
| DE | 195 32 251 A1 | 3/1997 | |
| DE | 199 30 190 A1 | 3/2001 | |
| EP | 1084790 * | 1/1997 | ........... B23K/35/26 |
| EP | 0 911 111 A2 | 4/1999 | |
| EP | 1084790 * | 3/2001 | ........... B23K/35/26 |
| WO | WO 89/02653 | 3/1989 | ........... H01L/23/12 |
| WO | WO 01/86715 A2 | 11/2001 | |

OTHER PUBLICATIONS

Kari Kulojarvi et al., "A Low Temperature Interconnection Method for Electronics Assembly," IEEE Transactions on Components, Packaging, and Manufacturing Technology, Part A, vol. 21, No. 2, Jun. 1998, pp. 288–291.

Albert Y. Kao et al., "Development of Compliant Solders for Flip–Chip Structures," Final Report 1997–1998 for Micro Project 97–216, Industrial Sponsor: Aguila Technology, Inc., 2 pgs.

Chin C. Lee, "Fluxless Bonding Technology for High Power Laser Diode Arrays," Final Report 1998–1999 for Micro Project 98–089, Industrial Sponsor: Coherent Semiconductor Group, 6 pgs.

MacKay, C.A., "Amalgams for Improved Electronics Interconnection", IEEE Micro, IEEE Inc., New York, vol. 13, No. 2, Apr. 1, 1993.

*Primary Examiner*—Long Pham
*Assistant Examiner*—Thao X. Le
(74) *Attorney, Agent, or Firm*—Hulsey Grether + Fortkort LLP; John A. Fortkort (57) ABSTRACT

A method for attaching a die (11) to a substrate (15) is provided. In accordance with the method, a die and a substrate are provided which are to be connected to each other across first and second surfaces. The first and second surfaces are contacted with a liquid solder composition (21) having a maximum melting temperature $T_{m1}$, of less than about 100 C. The liquid solder composition is contacted with a freezing agent (17 or 19) such that a second composition is formed which has a maximum melting temperature $T_{m2}$, wherein $T_2 - T_{m1}$ is at least about 25° C.

32 Claims, 5 Drawing Sheets

U.S. PATENT DOCUMENTS

| | | | | |
|---|---|---|---|---|
| 5,508,003 A | * | 4/1996 | Rancourt et al. | 420/555 |
| 5,522,535 A | * | 6/1996 | Ivanov et al. | 228/122.1 |
| 5,578,162 A | * | 11/1996 | D'Asaro et al. | 257/85 |
| 5,593,082 A | * | 1/1997 | Ivanov et al. | 228/122.1 |
| 5,653,856 A | * | 8/1997 | Ivanov et al. | 204/192.12 |
| 5,658,831 A | * | 8/1997 | Layton et al. | 29/832 |
| 5,746,927 A | * | 5/1998 | Hashimoto et al. | 216/18 |
| 5,964,395 A | | 10/1999 | Glovatsky et al. | 228/123.1 |
| 6,015,082 A | * | 1/2000 | Kivilahti | 228/180.22 |
| 6,153,940 A | | 11/2000 | Zakel et al. | 257/779 |
| 6,172,417 B1 | * | 1/2001 | Goossen | 257/723 |
| 6,249,051 B1 | * | 6/2001 | Chang et al. | 257/737 |
| 6,403,233 B1 | * | 6/2002 | Jin et al. | 428/672 |
| 6,541,301 B1 | * | 4/2003 | Raymond | 438/106 |
| 6,550,665 B1 | * | 4/2003 | Parrish et al. | 228/180.22 |

* cited by examiner

SOLDER COMPOSITIONS FOR ATTACHING A DIE TO A SUBSTRATE

FIELD OF THE INVENTION

The present invention relates generally to solder compositions, and more particularly to solder compositions useful for attaching a die to a substrate or package.

SUMMARY OF THE INVENTION

In one aspect, a method is disclosed herein for attaching an electronic component, such as a die, integrated circuit, or the like, to a substrate or package, comprising the steps of providing an electronic component and a substrate to be connected to each other across first and second surfaces with a liquid solder composition, and, in any order, either simultaneously or consecutively (a) contacting the first and second surfaces with the liquid solder composition, and (b) contacting the liquid solder composition with a freezing agent, wherein the liquid solder composition has a maximum melting temperature $T_{m1}$ of less than about 100 C. before it is exposed to the freezing agent, and wherein the liquid solder composition interacts with the freezing agent to form a second composition which has a maximum melting temperature $T_{m2}$, wherein $T_{m2}-T_{m1}$ is at least about 25° C. The liquid solder composition is preferably an alloy containing Ga, In, and Sn, and preferably has a melting temperature of less than about 75 C., more preferably less than about 50 C., and most preferably less than about 25 C. Preferably $T_{m2}-T_{m1}$ is at least about 50 C., more preferably $T_{m2}-T_{m1}$ is at least about 75 C., even more preferably $T_{m2}-T_{m1}$ is at least about 100 C., and most preferably, $T_{m2}-T_{m1}$ is at least about 125 C. The freezing agent may be a material such as, for example, gold, which may be plated onto one or both of the first and second surfaces.

In another aspect, a method is disclosed herein for attaching a die to a substrate, comprising the steps of providing a die having a first faying surface thereon, providing a substrate having a second faying surface thereon, said second faying surface comprising gold, applying a gallium-based liquid solder composition to at least one of the first and second faying surfaces, and bringing the first and second faying surfaces into sufficient proximity such that the liquid solder composition is in contact with the first and second faying surfaces. The liquid solder composition is preferably applied to only the first faying surface prior to the point at which the first and second faying surfaces are brought into sufficient proximity such that the liquid solder composition is in contact with the first and second faying surfaces. Preferably, the liquid solder composition contains X % by weight Ga, Y % by weight In, and Z % by weight Sn, based on the total weight of the alloy, wherein 0<X,Y,Z<100. More preferably, X is within the range of about 40 to about 80, Y is within the range of about 5 to about 25, and Z is within the range of about 10 to about 30. The gold on the second faying surface is adsorbed by the liquid solder composition, and acts as a freezing agent for the composition.

These and other aspects are described in further detail below.

DETAILED DESCRIPTION

As used herein, the term "maximum melting temperature" refers to the melting temperature of a composition, if the composition has a distinct melting point (as is the case, for example, with eutectic solders), or to the upper end of the melting range, if the composition melts over a range of temperatures (as is the case, for example, with non-eutectic solders).

As used herein, the term "freezing agent" refers to a material which, when added to a solder composition in relatively small amounts, has the effect of substantially increasing the maximum melting temperature of the composition.

One process common in the manufacture of semiconductor devices involves the attachment of a chip or die to its packaging or to another substrate. This process, called "die attach", has in the past been achieved through the use of conventional metal solders based on eutectic alloys, such as AuSi or AuSn. While such solders work well in certain situations and have some desirable properties, including high thermal and electrical conductivities and the ability to be reflowed, the use of these solders also has certain drawbacks. For example, conventional metal solders require high application temperatures (typically greater than 325° C.). However, the residual stresses accompanying use of a solder increase with the magnitude of the difference between the solder application temperature and the normal operating temperatures that the completed device is exposed to. Consequently, the use of high temperature solders can create large residual stresses on the die, thus requiring the package to be carefully engineered to avoid fracture. This is a highly undesirable drawback in light of the current trend toward lower cost packaging solutions.

Moreover, high application temperatures such as those required by conventional solders are destructive to some types of semiconductor devices, including those containing GaAs. However, there is presently great interest in GaAs based devices, due to its unique properties. For example, GaAs has the ability to convert electricity directly into coherent light, thus making it ideal for use in LEDs (light emitting diodes). Moreover, GaAs is a component in a number of semiconductor devices, including AlGaAs/GaAs and InGaP/GaAs Heterojunction Bipolar Transistors (HBTs). Consequently, the use of high melting temperature solders is not desirable in many modern die attach operations.

In additional to the metal solders noted above, various other types of solders are known to the art. These include various glasses, such as silver-filled, lead borate based formulations. However, these systems typically require application temperatures that are even higher than those associated with conventional solders, hence making them even less desirable in die attach applications.

A number of adhesive formulations have been developed for use in die attach applications, including those based on epoxies and cyanate esters. However, these materials suffer from various infirmities. For example, many of these adhesives are undesirable in that they provide poor thermal and electrical conductivities. Some attempts have been made to mitigate this shortcoming by adding metal fillers, such as silver, to these compositions, though this introduces stability and solubility considerations which often complicate the application of the adhesive. Most of these adhesives also require special storage provisions and/or preparations for their use, making them undesirable for use in low cost packaging applications. For example, some of these adhesives must be stored at temperatures of −40° C. or lower, and must be carefully warmed before use. Moreover, most of these adhesives must be cured at elevated temperatures (e.g., 150° C. or higher) in order to ensure proper polymerization or cross-linking. As with conventional metal solders, this is undesirable in applications involving GaAs or other temperature sensitive substrates. High cure temperatures also require more elaborate engineering to accommodate the residual stresses, hence making these adhesives poor candidates for low cost die packaging applications and other die attach operations.

The use of lead-based solders is also still quite prolific in industry. However, there is presently a movement toward lead-free solders, due to the obvious health and environmental issues related to the use of lead-based materials. The use of lead-free solders in flip-chip packaging and die attach has been investigated to a limited extent; however, many of the materials investigated thus far do not have the desirable mechanical properties afforded by traditional lead-based solders.

There is thus a need in the art for methods for achieving die attach which can employ lead-free solders and which can be used in flip-chip packaging and in other die attach operations. There is also a need in the art for methods for achieving die attach at low temperatures, and which are applicable to GaAs and other commonly used semiconductor substrates and materials.

Moreover, there is a need in the art for methods for achieving die attach that utilize solder compositions having a low melting point for the purposes of the die attach operation, but which can be made to have a substantially higher melting point thereafter so that the solder will not reflow without substantial heating. There is also a need in the art for methods for achieving die attach which utilize a solder composition that has good thermal and electrical conductivity and that does not require special storage or use considerations. These and other needs are met by the various methodologies and compositions disclosed herein for achieving the attachment of an electronic component, such as a die, to a substrate. Many of these methods may be employed at or near room temperature, and are useful in a variety of die attach applications, including die attach in flip chip and in other electronic packaging operations.

Figure 1:
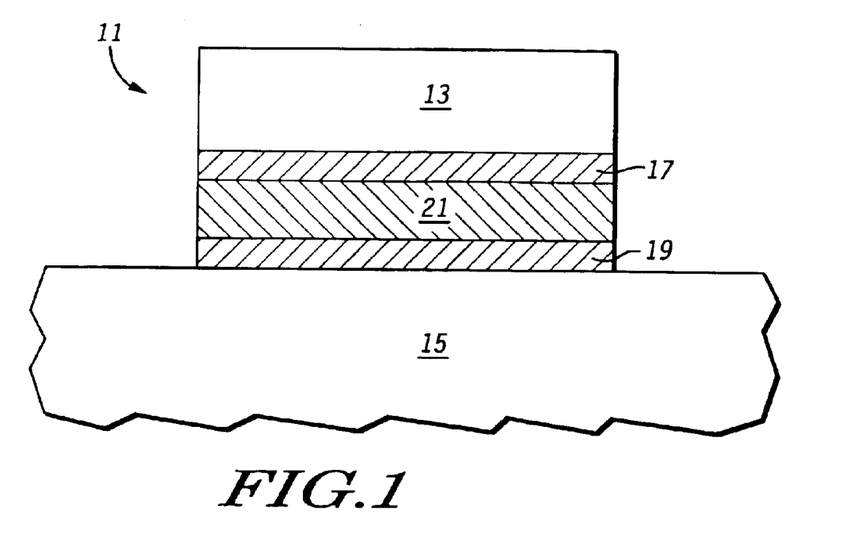
FIG. 1 is an illustrative diagram of a semiconductor die bond in accordance with the teachings herein.

FIG. 1 depicts a non-limiting example of a device 11 manufactured through the attachment of a die 13 to a substrate 15 in accordance with some embodiments of the methodology disclosed herein. The substrate may be, for example, a packaging substrate, a Printed Circuit Board (PCB), or another electronic component or substrate.

In the particular example illustrated, gold (in the form of gold plating) is used as the freezing agent. Hence, a first layer of gold 17 is disposed on the bonding surface of the die, a second layer of gold 19 is disposed on the bonding surface of the substrate, and a layer of a low melting temperature solder composition 21 is disposed between the first and second layers of gold. The solder composition is conveniently chosen to that it will be frozen by the gold after the die is properly positioned with respect to the substrate, thus yielding a solder joint with a higher maximum melting temperature than the original solder composition. One skilled in the art will appreciate, of course, that a similar effect can be achieved using only a single layer of gold, and that this single layer of gold could be disposed on either the die or the substrate. Moreover, materials other than gold can be employed as the freezing agent. The details of some possible freezing agent compositions, and methods for applying these freezing agents are described in greater detail below.

In accordance with some embodiments of the methodology disclosed herein, die attach in a device such as that shown in FIG. 1 can be achieved through the use of a low melting temperature solder composition which can be conveniently applied in a liquid state to the die and/or substrate (in some embodiments of the present invention, however, the solder may be applied in a non-liquid state). The solder composition can then be frozen by bringing it into contact with a freezing agent. The freezing agent serves to react with or diffuse into the solder composition (in some instances, the solder composition may diffuse into the freezing agent, or the solder and freezing agent may inter-diffuse) to yield a second composition that has a higher melting point than the original solder composition. Preferably, the melting temperature of the second composition is sufficiently high so that the solder composition undergoes a phase transition (e.g., it solidifies) at the temperature of application after the reaction or diffusion has progressed to a sufficient degree.

Figure 2:
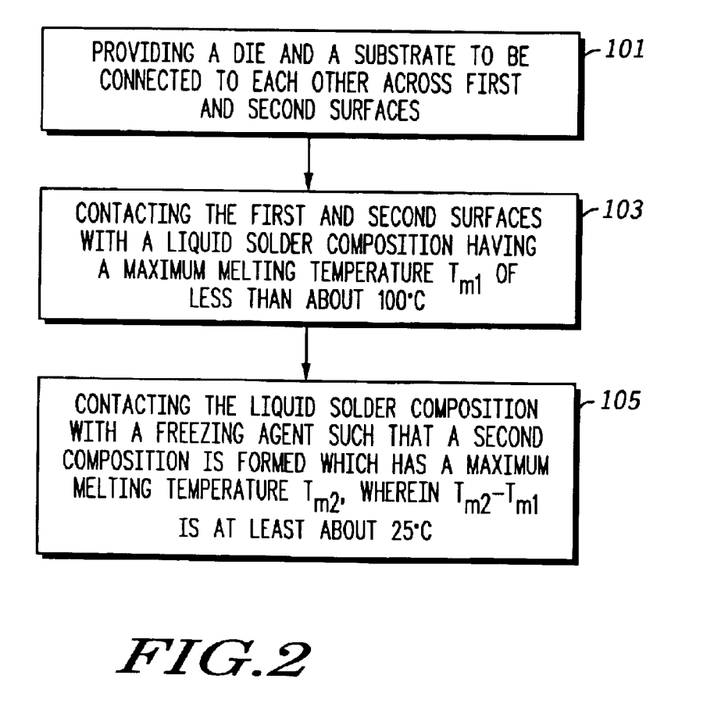
FIG. 2 is a flow chart illustrating a method for attaching a die to a substrate in accordance with the teachings herein.

FIG. 2 illustrates one possible embodiment of the methodology disclosed herein for attaching a die to a substrate. In accordance with this embodiment, a die and a substrate are provided 101 which are to be connected to each other across first and second surfaces. The first and second surfaces are contacted 103 with a liquid solder composition having a maximum melting temperature $T_{m1}$ of less than about 100 C. The liquid solder composition is then contacted 105 with a freezing agent such that a second composition is formed which has a maximum melting temperature $T_{m2}$, wherein $T_{m2}-T_{m1}$ is at least about 25° C. Through proper application of the liquid solder composition, the die will remain attached to the substrate (after the liquid solder composition is frozen) at temperatures above $T_{m1}$ but below $T_2$.

Figure 3:
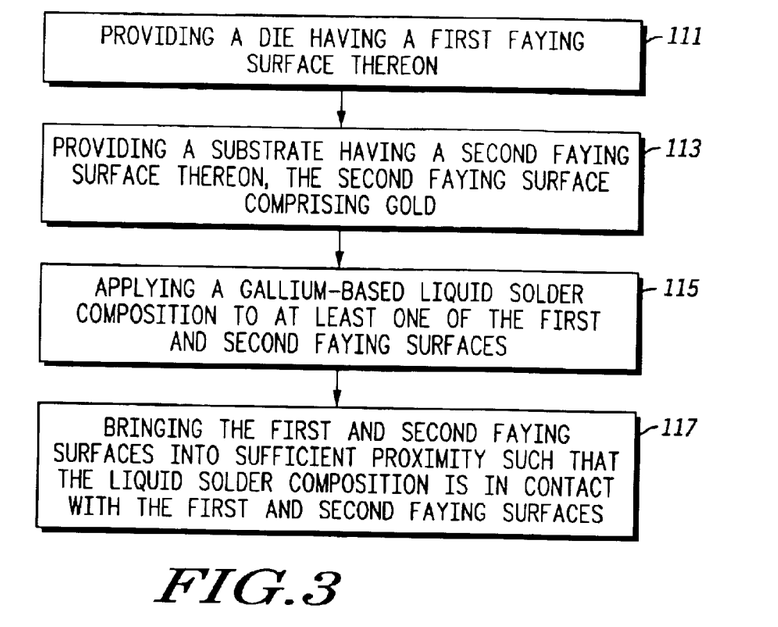
FIG. 3 is a flow chart illustrating a method for attaching a die to a substrate in accordance with the teachings herein.

FIG. 3 illustrates another possible embodiment of the methodology disclosed herein for attaching a die to a substrate. In accordance with this embodiment, a die is provided 111 which has a first faying surface thereon. A substrate is also provided 113 which has a second faying surface thereon, the second faying surface comprising gold. A gallium-based liquid solder composition is applied 115 to at least one of the first and second faying surfaces. The first and second faying surfaces are then brought 117 into sufficient proximity such that the liquid solder composition is in contact with the first and second faying surfaces. Over a period of time, the gold from the second faying surface diffuses into the gallium-based liquid solder composition, thus freezing the liquid solder composition and adhering the die to the substrate.

Figure 4:
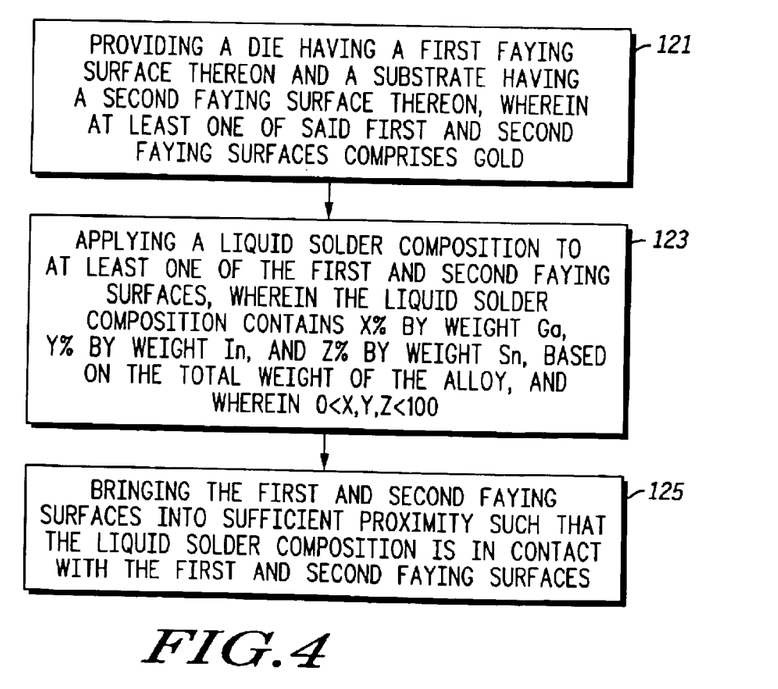
FIG. 4 is a flow chart illustrating a method for attaching a die to a substrate in accordance with the teachings herein.

FIG. 4 illustrates still another possible embodiment of the methodology disclosed herein for attaching a die to a substrate. In accordance with this embodiment, a die is provided 121 having a first faying surface thereon, and a substrate is provided having a second faying surface thereon. At least one of the first and second faying surfaces comprises gold. A liquid solder composition is then applied 123 to at least one of the first and second faying surfaces. The liquid solder composition contains X % by weight Ga, Y % by weight In, and Z % by weight Sn, based on the total weight of the alloy, wherein 0<X,Y,Z<100. The first and second faying surfaces are then brought 125 into sufficient proximity such that the liquid solder composition is in contact with the first and second faying surfaces. Over a period of time, the gold diffuses into the liquid solder composition, thus freezing the liquid solder composition and adhering the die to the substrate.

While FIGS. 2–4 illustrate some specific embodiments of the methodologies described herein, one skilled in the art will appreciate that various modifications of these and other methodologies disclosed herein are possible. Thus, for example, in the various methodologies disclosed herein, the step of contacting a liquid solder composition with the surfaces to be joined together, and the step of freezing the liquid solder composition with a freezing agent, may occur in any order, and may also occur simultaneous (e.g., as part of a single step in the process) or consecutively (e.g., as disparate steps in the process). Some of the details and possible variations of the methodologies disclosed herein for attaching a die to a substrate are discussed below.

A. Solder Compositions

Various solder compositions, including both eutectic and non-eutectic compositions, can be used in the practice of the methodologies disclosed herein. As indicated above, it is generally preferred that the solders employed in these methodologies have a relatively low maximum melting temperature, but are capable of reacting with a freezing agent to yield a new composition that has a higher maximum melting temperature than the original solder composition.

One class of solders that work particularly well in the methodologies disclosed herein have the general formula $Ga_xIn_ySn_z$, wherein 0<X,Y,Z<100. Preferably, X is within the range of about 40 to about 80; more preferably X is within the range of about 50 to about 70; and most preferably, X is within the range of about 55 to about 65. Preferably, Y is within the range of about 5 to about 25; more preferably Y is within the range of about 10 to about 20; and most preferably, Y is within the range of about 12 to about 18. Preferably, Z is within the range of about 10 to about 30; more preferably, Z is within the range of about 15 to about 25; and most preferably, Z is within the range of about 18 to about 22.

Several compositions within this class of solders are liquid at or near room temperature, and are readily frozen by the small amounts of gold that are frequently present on the die backside and on the bonding surfaces of substrates to which die are commonly attached. Moreover, gold diffuses into many of these compositions at a sufficiently fast rate so that the phase transition occurs relatively quickly. Consequently, die attach can be readily achieved with these solders at or near room temperature simply by placing the solder on the die and then bringing the die into contact with the bonding surface of the substrate. Melting temperatures in excess of 150 C. are readily achievable in the frozen compositions. These temperatures are well above the temperatures that these packages are typically exposed to in use. If desired, the melting temperature of the frozen solder composition can be manipulated, as by changing the ratios of its constituents, so that it coincides with the upper range of the temperature cycle that the package is typically exposed to; this allows for occasional solder reflow, which in some cases may impart self-healing characteristics to the solder joint.

Various indium-based solders, in addition to those noted above, can also be used in the practice of the methodologies disclosed herein. These include, for example, INDALLOY® brand indium alloy solder formulations manufactured by the Indium Corporation, such as INDALLOY® 162 (a solder composition consisting of 66.3% In and 33.7% Bi and having a maximum melting temperature of 72C.), INDALLOY® 19 (a solder composition consisting of 16.5% Sn, 32.5% Bi and 51% In and having a maximum melting temperature of 60° C.), INDALLOY® 8 (a solder composition consisting of 44% In, 42% Sn and 14% Cd and having a maximum melting temperature of 93° C), INDALLOY® 17 4 (a solder composition consisting of 17% Sn, 57% Bi and 26% In and having a maximum melting temperature of 79° C), and INDALLOY®27 (a solder composition consisting of 16.3% Sn, 54% Bi and 29.7% In and having a maximum melting temperature of 81° C.).

A variety of bismuth-based solders (in addition to those noted above) may also be used in the methodologies disclosed herein. These include, for example, various alloys of bismuth with tin, lead, and/or antimony, such as Sn—Bi and Sn—B—-Pb solder compositions.

TABLE 1 below lists some metal alloys useful as solder compositions in certain applications or embodiments of the methodologies disclosed herein. Though all of these materials are "low melting temperature" solder compositions in the sense that they exhibit maximum melting points that are lower than those of most conventional solder compositions, not all of these compositions are suitable for use in all applications. Rather, the temperature sensitivity of the substrate and any nearby components must be considered in selecting a solder composition for a particular application.

Compositions 25 and 26 of TABLE 1 are particularly notable. Like many other members of the family of solder compositions having the general formula $Ga_xIn_ySn_z$, compositions 25 and 26 are liquids at room temperature. This greatly facilitates their application, and makes them ideal for use in conjunction with temperature sensitive substrates such as those which contain GaAs or photodetector materials.

TABLE 1

Some Low Melting Temperature Solder Compositions

| Composition No. | Alloy Composition | Melting Point (° C.) |
| --- | --- | --- |
| 1 | Sn—Bi—Pb | 96 |
| 2 | Sn—Bi—Pb | 99–139 |
| 3 | Sn—Bi | 139 |
| 4 | $Sn_{43}Pb_{43}Bi_{14}$ | 144–163 |
| 5 | $Sn_{48}IN_{52}$ | 118 |
| 6 | $Sn_{43}Bi_{52}$ | 138 |
| 7 | $Bi_{58}Sn_{42}$ | 138 |
| 8 | $Bi_{25}Sn_{75}$ | |
| 9 | $Bi_{76}Sn_{24}$ | |
| 10 | $Bi_{70}In_{15}Sn_{15}$ | |
| 11 | $Bi55In_{15}Sn_{30}$ | |
| 12 | $Bi_{10}In_{20}Sn_{70}$ | |
| 13 | $Bi_{70}In_{15}Sn_{15}$ | |
| 14 | $Bi_{70}In_{10}Sn_{20}$ | |
| 15 | $Bi_{44.7}Pb_{22.6}Sn_{8.3}Cd_{5.3}In_{19.1}$ | 47 |
| 16 | $Bi_{49}Pb_{18}Sn_{12}In_{21}$ | 58 |
| 17 | $Bi_{48}Pb_{25.63}Sn_{12.77}Cd_{9.6}In_4$ | 61–65 |
| 18 | $Bi_{50}Pb_{26.7}Sn_{13.3}Cd_{10}$ | 70 |
| 19 | $Bi_{42.5}Pb_{37.7}Sn_{11.3}Cd_{8.5}$ | 70–88 |
| 20 | $Bi_{52.5}Pb_{32}Sn_{15.5}$ | 95 |
| 21 | $Bi_{48}Pb_{28.5}Cd_{14.5}An_9$ | 103–227 |
| 22 | $Bi_{55.5}Pb_{44.5}$ | 124 |
| 23 | $Bi_{58}Sn_{42}$ | 138 |
| 24 | $Bi_{60}Sn_{40}$ | 138–170 |
| 25 | $Ga_{76}In_{24}$ | Below RT |
| 26 | $Ga_{62.5}Sn_{21.5}In_{16}$ | Below RT |

B. Solder Freezing Agents

Various materials may be used as freezing agents for solder compositions in the methodologies disclosed herein.

Preferably, these materials have the ability to diffuse into, or be absorbed by, the solder composition, with the effect of substantially increasing the maximum melting temperature of the composition. Ideally, the increase in maximum melting temperature occurs sufficiently fast so that the material undergoes a fairly rapid phase transition.

Figure 5:
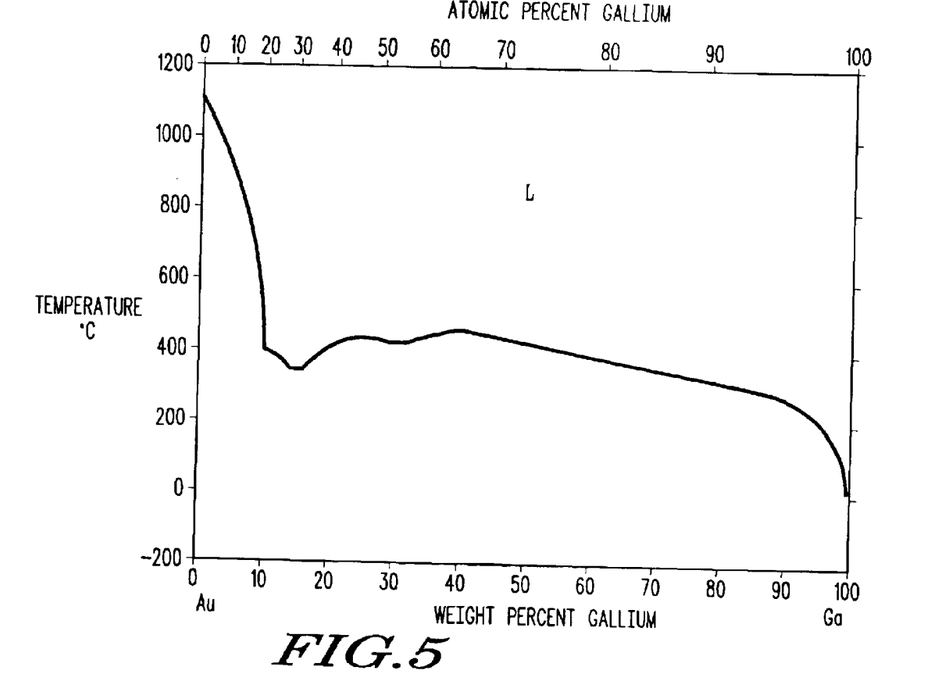
FIG. 5 is a phase diagram for gallium-gold alloys.

The choice of freezing agent, and the amount of freezing agent employed, will depend in part on the solder composition to be used and the desired melting temperature of the frozen composition. In the case of many solder compositions comprising low melting temperature gallium alloys (many of which are liquid at room temperatures), for example, Au and Au alloys are preferred freezing agents because they readily diffuse into these solder compositions. Moreover, the diffusion of even small amounts of these materials into gallium-based solder compositions often has the effect of raising the maximum melting temperature of these compositions to well above the normal operating temperatures of most devices that die are commonly incorporated into. Thus, as indicated in the phase diagram of FIG. 5, the addition of as little as 2% gold to pure gallium raises the melting temperature of the gallium to above about 150 C. The effect of gold on many gallium alloys is even more pronounced, since some of these alloys have lower melting temperatures than that of pure gallium (pure gallium melts at 29.8 C. or 85.6 F.), but freeze upon addition of small amounts of gold to yield alloys with maximum melting temperatures similar to that of binary Ga—Au alloys.

Figure 6:
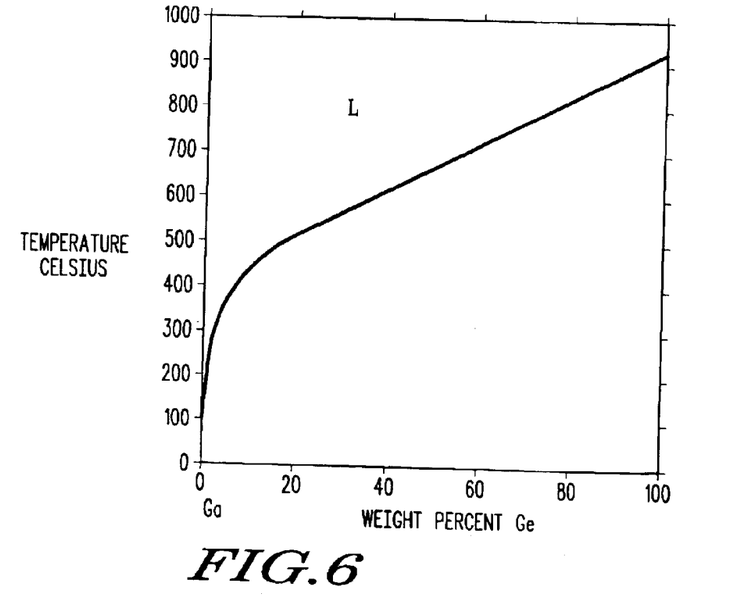
FIG. 6 is a phase diagram for gallium-germanium alloys.
Figure 7:
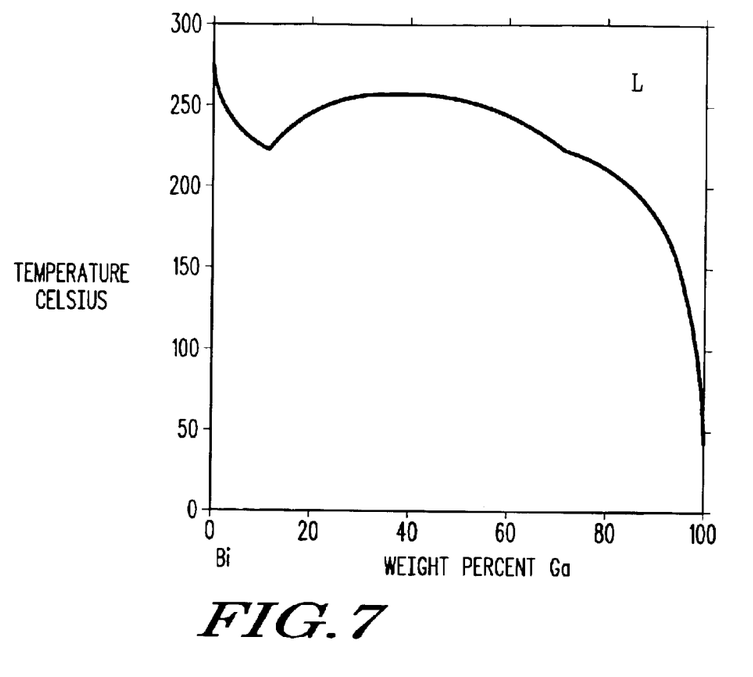
FIG. 7 is a phase diagram for gallium-bismuth alloys.
Figure 8:
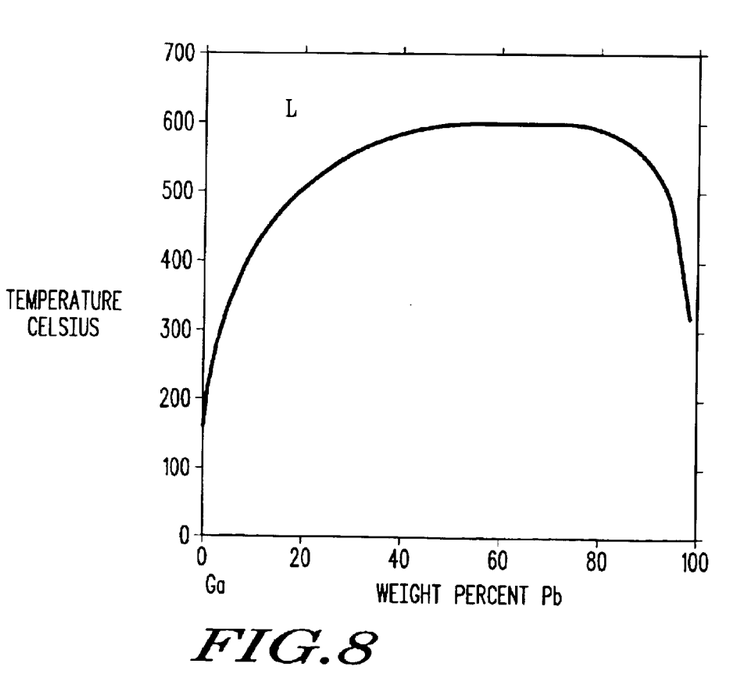
FIG. 8 is a phase diagram for gallium-lead alloys.

As shown in the phase diagrams of FIGS. 6–8, Ge, Bi and Pb are also effective freezing agents for pure gallium, as is silver (not shown) (these freezing agents have a similar effect on several gallium alloys, including many of those of the general formula $Ga_xIn_ySn_z$). Thus, as seen in the phase diagram of FIG. 6, the addition of fairly minute amounts of Ge (about 1% by weight) to gallium raises the melting temperature of the composition to about 175 C., and slightly larger quantities (about 2% by weight) push the melting temperature to above 200 C. Similar results are achieved with the use of lead as a freezing agent, as shown in the phase diagram of FIG. 8, where the addition of only a few % by weight raises the melting temperature of the composition to above 200 C. As shown in the phase diagram of FIG. 7, somewhat larger amounts of bismuth are required to achieve a similar result (e.g., greater than about 5% by weight of Bi is required to raise the melting temperature of the composition to above 150 C.), though the need for a larger amount of freezing agent here may be offset somewhat by cost, solubility and environmental considerations.

Figure 9:
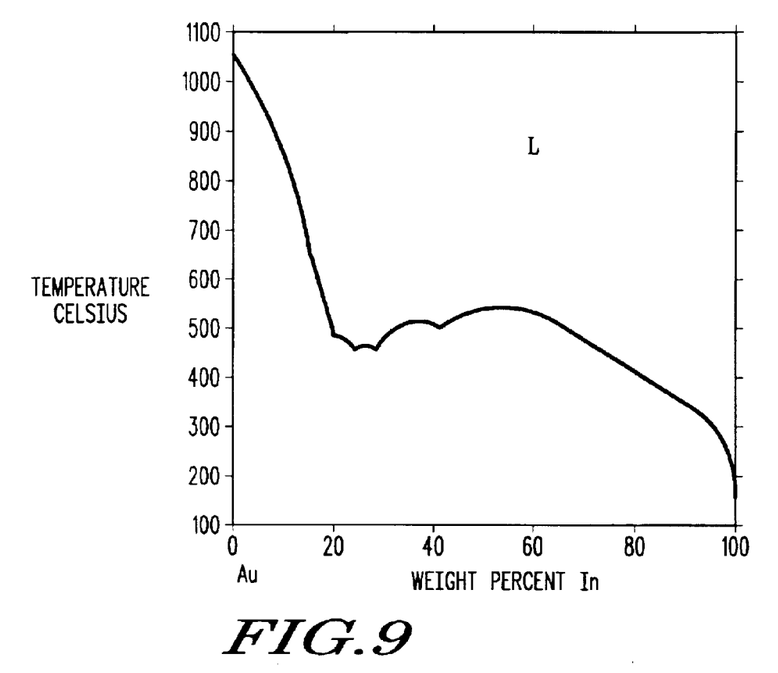
FIG. 9 is a phase diagram for indium-gold alloys.

The phase diagram in FIG. 9 demonstrates the effectiveness of gold as a freezing agent in pure indium. Since indium itself has a higher melting temperature than both gallium itself and the gallium alloys noted above, the temperature differential achieved by the use of gold as a freezing agent is not as dramatic with pure indium as with the former compositions, at least in terms of the maximum melting temperature differential achieved. However, many indium alloys (in addition to the indium-gallium alloys noted above) have maximum melting temperatures below that of indium itself, but are frozen by gold to yield compositions having maximum melting temperatures similar to those achieved by samples of pure indium which have been frozen by gold in accordance with FIG. 9.

Figure 10:
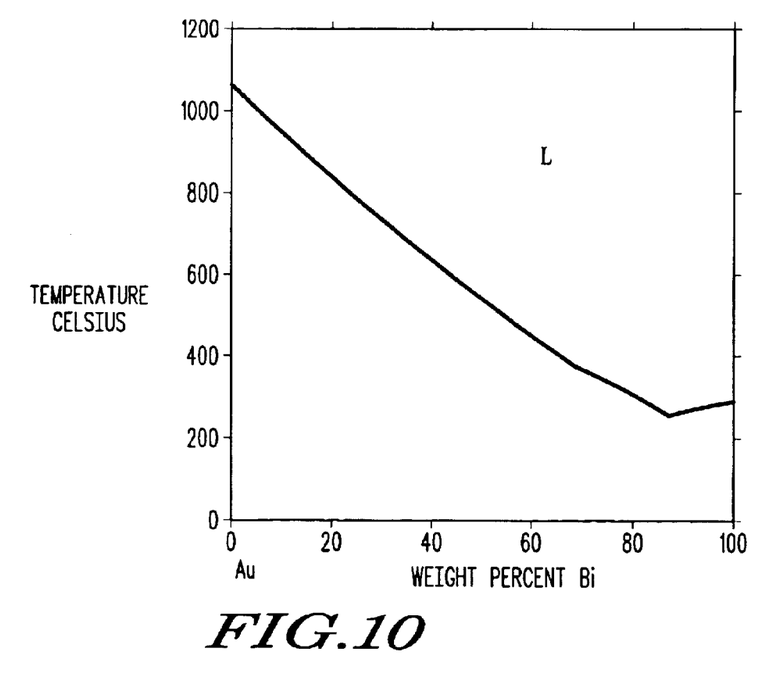
FIG. 10 is a phase diagram for bismuth-gold alloys.

The phase diagram of FIG. 10 demonstrates the fact that not all metals or metal alloys which have low maximum melting temperatures are effectively frozen by gold or other such freezing agents. Thus, as seen in this diagram, the addition of gold to pure bismuth does not freeze the composition unless excessive amounts of gold are added. To the contrary, in the compositional range over which most suitable freezing agents would be required to function, gold actually reduces the maximum melting temperature of pure bismuth.

C. Methods of Applying Solder Freezing Agents

The low melting temperature solder compositions employed in some of the methodologies disclosed herein may be frozen in a number of different ways. Preferably, this is accomplished by bringing the solder into contact with a substrate containing the freezing agent, a step which preferably occurs when the solder is in contact with the surfaces to be joined together. Thus, in the case of gallium-based solders, a gold-bearing substrate may preferably be employed. Since the surfaces for die packaging and other die attach substrates are often plated with a thin layer of gold, and since the amounts of gold present on such surfaces is often sufficient to freeze the amounts of gallium-based solder commonly used in a typical die attach operation, the reliance on gold for the freezing agent is particularly advantageous in that it avoids the additional processing steps or considerations that might otherwise be required in some die attach applications. It is to be noted here that the use of a gold-bearing substrate in a solder reflow operation would normally be avoided, since the presence of gold has an adverse effect on many conventional solder compositions. Thus, in the case of common Sn—Pb solder compositions, the presence of gold during solder reflow can lead to embrittlement of the resulting solder joint, thus significantly reducing the life of the joint.

While it is preferred that the freezing agent is plated or otherwise deposited onto a faying surface into which the solder composition will come into contact, the freezing agent may be combined with, or brought into contact with, the solder composition in a variety of other ways. For example, the solder can be formulated as a two phase or multi-phase system such as, for example, a disperse phase of the freezing agent disposed within a continuous matrix of the composition to be frozen. In such a system, the phases may be capable of interacting to form a product having a higher melting temperature than the material of the continuous phase. Thus, in one specific example of such a system, a disperse phase comprising gold is disposed within a continuous phase comprising gallium. The disperse phase material may be coated with a composition, such as a polymer, metal, or metal alloy, that is inert to gallium, thus preventing the gold from reacting with the gallium in the continuous phase. However, the coating is removable, as, for example, by the application of heat or a solvent or by abrasion, mixing, irradiation or sonication of the solder composition, after which the gold proceeds to freeze the continuous phase.

In another example, the continuous and disperse phase are in direct contact, but require an activation energy in order for the freezing reaction to progress to a significant extent. In such a system, freezing may be accomplished simply by heating the composition, or by subjecting the composition to one or more of the processes described above with respect to coating removal.

In still another example of a method by which a freezing agent may be applied, first and second faying surfaces are arranged in contact with a solder paste to form an assembly. The solder paste comprises a mixture of a first and a second metal powder, the first metal powder being formed of a solder alloy composed predominantly of gallium and indium and having a melting temperature of less than about 100 C., and the second metal powder comprising a tertiary metal, preferably selected from the group consisting of gold and silver, which is present in an amount effective to act as a freezing agent. The assembly is then heated to a temperature effective to melt the solder alloy to form a solder liquid and to dissolve said tertiary metal into the solder liquid. After this, the assembly is cooled to solidify the solder liquid and to form a solder connection bonded to the first and second faying surfaces and composed of a solder alloy containing the tertiary metal and exhibiting an increased melting temperature.

In another example, the freezing agent is applied by a vapor deposition process or by ion implantation shortly before or after the solder composition is in place.

D. Solder Types

The solder compositions used in the practice of the methodologies disclosed herein may assume a variety of forms. At room temperature, they may exist as pastes, powders, mixtures, liquids, solids, or suspensions. They may be based on elemental substances, or on binary, tertiary, quaternary, or higher level alloys, mixtures or blends of such substances.

The solder compositions used in the practice of the methodologies disclosed herein may also have various morphologies. Thus, for example, the solder compositions used in the practice of the methodologies disclosed herein may be homogeneous or inhomogeneous. In some embodiments, the solder compositions may have a continuous/disperse phase morphology or a core/shell morphology. Thus, for example, in some embodiments, the solder compositions may comprise a first composition that exists as a discontinuous phase disposed in a continuous matrix of a second composition. In other embodiments, the solder compositions may comprise a shell of a first composition that is disposed about a core of a second composition. Various embodiments may also include combinations of two or more of the aforementioned morphologies.

In some particular embodiments, the solder composition may comprise a matrix of a first material, such as gallium, that has particles of a second material, such as gold, disposed therein as a second phase, and wherein the first and second material are capable of interacting with each other in such a way that the matrix solidifies or freezes. The particles may be coated with a substance, such as a low melting wax, polymer or metal, that serves to keep the two phases from reacting with each other at temperatures lower than about $T_1$. However, at temperatures in excess of $T_1$, the coating may be designed to melt or to dissolve into one or both phases, thus allowing the two phases to react with each other to freeze or solidify the solder composition. In these embodiments, $T_1$ will typically be chosen to be somewhat above normal room temperatures, though $T_1$ may also be selected to be above a convenient storage temperature for the solder composition.

In some variations of this embodiment, the coating may comprise a frangible material. This coating may be broken to freeze the solder composition through mechanical agitation of the solder composition, through vibration (e.g., through the use of a sonicator), or through other such means. The coating may also be fractured through thermal manipulation of the solder material itself. Thus, for example, if the material of the disperse phase changes volume significantly upon heating or cooling or undergoing a phase transition, the solder composition may be subjected to sufficient temperatures or thermal cycling to effect fracture of the coating. For example, a disperse phase comprising pure, or nearly pure, gallium will typically expand significantly upon freezing. Hence, in such an embodiment, thermal cycling, and specifically cooling the disperse phase below its freezing point, can be used to rupture the coating. In other variations of this embodiment, the coating is a material that can be melted or degraded upon exposure to radiation. The solder composition is then positioned properly with respect to the faying surfaces to be joined, and an appropriate amount of radiation is applied to melt or degrade the coating so that the solder and the freezing agent can react with each other.

In still other embodiments, the solder composition may comprise a solder ball having a core comprising a first material and an external layer or coating comprising a second material, and wherein the second material comprises a low melting temperature material, such as, for example, gallium or an alloy thereof. The first material may be a material, such as, for example, tin, lead, or an alloy of the two, which has a higher melting temperature than the second material. In use, the solder ball is heated sufficiently to melt the second material, and is brought into contact with one or more surfaces which are to be joined together. At least one of these surfaces is provided with a third material, such as, for example, gold, which is capable of freezing the second material. Alternatively, the first material may be selected as a material that freezes the second material, so that the use of a third material as the freezing agent is not necessary. Thus, for example, if a gallium alloy is used as the second material, a lead-based solder may be used as the first material and will effectively freeze the gallium alloy. Of course, proper precautions, such as the existence of a temporary, inert layer between the first and second materials, may be needed to prevent the second material from freezing prematurely.

In still other embodiments of the methodologies disclosed herein, the initial solder composition may consist of a mixture of a first plurality of particles of one or more primary metals or metal alloys that form the basis of the solder composition, and a second plurality of particles of one or more secondary metals or metal alloys that serve to react with the primary metals or metal alloys to improve the thermal properties thereof. Typically, the improvement in thermal properties will be in the form of an increased melting temperature, though in some cases the improvement in thermal properties may be an increase in hardness over typical operating temperatures for the metal joint.

In other embodiments, multilayered solder constructs may be used such as, for example, to avoid the need to have the solder composition and the freezing agent on separate surfaces. For example, the solder composition and the freezing agent can be formed as separate layers in a multilayer construction, and may be separated from each other by a material that is essentially inert to both components. In a specific example of such an embodiment, a layer of solder comprising gallium or an alloy thereof is deposited on a faying surface, and layers of chromium, and then gold, are deposited, via vapor deposition or by other such means, over the solder. At temperatures below the melting point of the solder, the chromium prevents the gold from diffusing into the solder (or vice versa). However, when the solder is heated to its melting point, the chromium will dissolve into the solder, thus allowing the gold to freeze the solder composition. The amounts of these materials and the layer thicknesses can be controlled so that the solder composition remains in its molten state long enough for it to be brought into contact with a second faying surface for the purposes of, for example, die attach.

In the multilayer structures made in accordance with the teachings disclosed herein, the solder and freezing agent may also be spatially separated from each other. Thus, for example, the solder may be separated from the freezing agent by way of a porous membrane or structure such that, when the solder is reflowed, it penetrates the membrane or structure to react with the freezing agent on the other side. Gallium and its alloys are especially useful in this type of embodiment, given gallium's excellent wetting properties.

In some embodiments, the crystallinity of the freezing agent may be used to delay the onset of freezing, or to prevent or inhibit freezing until the solder composition and/or freezing agent is heated above a particular temperature. This temperature may be, for example, a temperature at which the freezing agent undergoes a phase transition from a crystalline state to an amorphous or semi-amorphous state.

E. Substrate Materials

The solders employed in many of the methods disclosed herein can be used in conjunction with substrates that would be damaged by the melting temperatures encountered with the use of traditional solders having higher melting points. Such substrates include, for example, those based on GaAs or containing photodetector materials or devices, as well as those containing polymeric materials such as polyethylene terephthalate (PET), polyethylene naphthalate (PEN), acrylonitrile-butadiene-styrene (ABS), and various polyamide substrates. Many of these substrates are damaged at temperatures in excess of about 150° C., and indeed, some of these substrates are damaged at temperatures in excess of about 105° C.

The ability of some of the solder compositions described herein to provide die attach with high electrical and thermal conductivity to thermally sensitive substrates permits or facilitates the use of these compositions in die attach operations where conventional solder compositions ordinarily could not be used. Thus, for example, some of the solder compositions disclosed herein can be used to attach die to plastic substrates, polymeric substrates, fibrous substrates, films (including mirrors, polarizers, diffusers, and other optical films), substrates comprising paper or paper products (e.g., cardboard or paper products, including those treated with a repositionable adhesive), and the like. This is especially so when the solder compositions comprise gallium, since gallium and many of its alloys exhibit an excellent tendency to wet a variety of surfaces, thus resulting in a stronger bond as compared to solder compositions that wet less easily. Indeed, in many applications, the use of such solders avoids the need for fluxes or primers.

One particularly useful application of some of the low melting point solders disclosed herein is in smartcard applications, since it is frequently desirable in these applications to attach a die to a substrate comprising plastic. While epoxies and other adhesives have frequently been used for this purpose, many of the solder compositions disclosed herein are advantageous over such adhesives in that they are more resistant to certain types of tampering schemes (e.g., the swelling or dissolution of the adhesive through the use of certain acids).

F. Liquid Vehicles

In some solder compositions, it may be desirable or advantageous to employ a liquid or gelatinous medium in the composition. Various materials may be used as the medium for this purpose. These include, for example, alcohols, glycols, and mixtures of the foregoing. Through appropriate selection of such parameters as molecular weight, number of hydroxyl groups (in the case of alcohols and glycols), and the disposition of the hydroxyl groups (e.g., whether they are primary, secondary or tertiary), these materials can be made to exhibit a wide range of boiling temperatures. Many compositions used in the practice of the methodologies described herein can be made using such a liquid medium and thus can be conveniently utilized as solder pastes.

G. Solder Fluxes

Though many of the solder compositions used in the practice of the methodologies disclosed herein, especially those based on gallium alloys, will often not require a solder flux, the use of a flux may be advantageous with some solder compositions or in certain applications. Various materials may be used as fluxes for this purpose. These materials include various materials that promote the fusing of the component metals of the solder compositions with each other or with the metals of the faying surfaces, and/or materials that prevent or inhibit the formation of the oxides of these metals. Suitable examples of useful solder fluxes include, but are not limited to, white rosin compounds.

H. Binders

In some instances, the solder compositions used in the practice of the methodologies disclosed herein may also comprise a binder. Binders are especially useful in powder solder compositions, where they serve to hold the powder in a self-sustaining mass following application. This binder will most typically be an organic material, such as, for example, ethyl cellulose.

I. Methods of Application of Solder Compositions

The solders used in the methodologies described herein may be applied in a variety of ways to a substrate, some of which have been described above. Preferably, the solder is deposited in a molten or semi-molten state on a first faying surface, and is brought into contact with a second faying surface having a freezing agent disposed thereon while the solder composition is in a molten or semi-molten state. In a specific, non-limiting example, the solder ball comprises a gallium alloy and is disposed on a first faying surface associated with or disposed on a die, and the second faying surface, which is disposed on a die package or other substrate, comprises a layer of gold which has been formed, for example, through vapor deposition. However, various other methods of application are also possible. For example, if the solder is in the form of a paste, it may be conveniently applied by screen printing.

The solder compositions described herein may also be applied to a substrate using various other methodologies. These include, for example, galvanic deposition, vapor deposition, molten deposition, and various combinations of these methodologies. Thus, for example, in some embodiments, a solder ball may be formed by depositing a molten gallium alloy, allowing the alloy to harden, and then vapor depositing a gold layer on the hardened alloy. In some variations, a thin protective coating or layer may be disposed between the gold and the gallium alloy. During reflow, the gold and the gallium alloy interact to form a new alloy having a higher melting temperature than the original gallium alloy.

J. Faying Surfaces

The solder compositions described herein can be used to join together a variety of faying surfaces. For example, one such faying surface may be the bonding surface of a printed circuit board, and another faying surface may be a bonding surface or contact pad disposed on an electrical component to be mounted on the printed circuit board. The solder compositions disclosed herein are also especially useful in binding together the faying surface of a die or dice and that of a chip package surface (e.g., the surface of a metal lead from an electronic substrate, a semiconductor substrate or the like).

K. Miscellaneous Additives

The solder compositions utilized in the practice of the methodologies disclosed herein may contain, or be used in conjunction with, various additives, agents, materials, or ingredients. These include, without limitation, primers, fluxes, wetting agents, reinforcing agents, surfactants, carriers and hardeners.

L. Melting Temperatures

The solder compositions utilized in the methodologies disclosed herein can have various maximum melting temperatures, both before and after exposure to a freezing agent. These solder compositions will typically have an initial maximum melting temperature $T_1$ which is below about 150 C., preferably below about 125 C., more preferably below about 100 C., and even more preferably below about 50 C. Most preferably, the solder compositions will have a melting point near or below room temperature (i.e., less than about 23 C.) so that they may be applied as a liquid with little or no heating. Examples of the later compositions include alloys of gallium and indium such as $Ga_{76}In_{24}$, which is a liquid at room temperature.

Upon exposure to a freezing agent, the solder compositions disclosed herein will typically exhibit an increase in melting point of at least 25 C., preferably at least 50 C., more preferably at least 75 C., and most preferably at least 100 C., depending in part on the initial melting point $T_1$. Typically, the new melting temperature $T_2$ will be at least 50 C., preferably at least 75 C., more preferably at least 100 C., and most preferably at least 150 C. While the ideal values for $T_1$ and $T_2$ will depend to some extent on the intended use for the device to which the solder composition is applied and the temperature sensitivity of the substrate, $T_1$ will typically be low enough so that the temperatures required for application of the solder composition to the substrate to which it is applied will not damage the substrate or any surrounding materials. On the other hand, $T_2$ will typically be high enough so that the solder bond will not be significantly weakened by the normal thermal cycling to which the device is exposed.

In some applications, a high $T_2$ (e.g., greater than about 150 C.) is preferable. For example, a high $T_2$ may allow the composition to maintain a high joint strength throughout the normal temperature cycles that the device is exposed to. In other applications, however, a lower $T_2$ may be more desirable. For example, some solder compositions exhibit an ability to "self-heal" during reflow, so that cracks or defects caused by the application of stress or strain are repaired when the solder is liquefied and then re-hardened. Hence, with these applications, if $T_2$ is within the upper portion of the temperature cycles that the device is normally exposed to, the solder joint may actually exhibit longer average lifetimes than some higher melting solder compositions.

Methods have been disclosed herein for using low melting temperature solder compositions in flip chip packaging and in die attach operations. These methods can be used to achieve die attach at low temperatures, and hence are ideal for use with temperature-sensitive substrates such as those often encountered in flip chip applications (such substrates may contain, for example, temperature sensitive materials such as GaAs, or temperature sensitive components such as photodiodes). Moreover, these solders may be exposed to a freezing agent so that they will have a substantially higher melting point after application. Many of the solders useful in these methodologies are lead-free, have good thermal and electrical conductivity, and do not require special storage or use considerations.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed solely in reference to the appended claims.

What is claimed is:

1. A method for attaching an electronic component to a substrate, comprising the steps of:

providing an electronic component and a substrate to be connected to each other across first and second surfaces with a liquid solder composition; and in any order, either simultaneously or consecutively (a) contacting the first and second surfaces with the liquid solder composition, and (b) contacting the liquid solder composition with a freezing agent;

wherein the step of contacting the liquid solder composition with the freezing agent comprises the steps of (a) depositing the solder composition on the first surface as a liquid, (b) allowing the liquid solder composition to harden, (c) depositing a freezing agent on the hardened solder composition, and (d) reflowing the solder composition, wherein the liquid solder composition has a maximum melting temperature $T_{m1}$ of less than about 100° C. after it is deposited but before it is exposed to the freezing agent, and wherein the liquid solder composition interacts with the freezing agent to form a second composition which has a maximum melting temperature $T_{m2}$, wherein $T_{m2}-T_{m1}$ is at least about 25° C.

2. The method of claim 1, wherein the electronic component is a die.

3. The method of claim 1, wherein the freezing agent is gold.

4. The method of claim 3, wherein the freezing agent as also disposed on at leant one of the first and second surfaces.

5. The method of claim 1, wherein $T_{m1}$ is less than about 75° C.

6. The method of claim 1, wherein $T_{m1}$ is less than about 50° C.

7. The method of claim 1, wherein $T_{m1}$ is less than about 25° C.

8. The method of claim 1, wherein $T_{m2}$ is at least about 50° C.

9. The method of claim 1, wherein $T_{m2}$ is at least about 75° C.

10. The method of claim 1, wherein $T_{m2}$ is at least about 100° C.

11. The method of claim 1, wherein $T_{m2}$ is at least about 125° C.

12. The method of claim 11, wherein $T_{m1}$ is less than about 25° C.

13. The method of claim 1, wherein the liquid solder composition comprises gallium.

14. The method of claim 1, wherein the liquid solder composition comprises indium.

15. The method of claim 1, wherein the liquid solder composition comprises gallium and indium.

16. The method of claim 1, wherein the liquid solder composition contains X % by weight Ga, Y% by weight In, and Z% by weight Sn, based on the total weight of the alloy, and wherein 0<X,Y,Z<100.

17. The method of claim 16, wherein X is within the range of about 40 to about 80.

18. The method of claim 16, wherein X is within the range of about 50 to about 70.

19. The method of claim 16, wherein Y is within the range of about 5 to about 25.

20. The method of claim 16, wherein Y is within the range of about 10 to about 20.

21. The method of claim 16, wherein Z is within the range of about 10 to about 30.

22. The method of claim 16, wherein Z is within the range of about 15 to about 25.

23. The method of claim 16, wherein X is within the range of about 40 to about 80, Y is within the range of about 5 to about 25, and Z is within the range of about 10 to about 30.

24. The method of claim 1, wherein the electronic component is a semiconductor die, and wherein the first surface is disposed on the die and the second surface is disposed on a packaging substrate.

25. The method of claim 24, wherein the packaging substrate comprises GaAs.

26. The method of claim 1, wherein the amount of freezing agent added to the liquid solder composition is less than about 2% by weight.

27. The method of claim 1, wherein the amount of freezing agent added to the liquid solder composition is less than about 1% by weight.

28. The method of claim 1, further comprising the step of disposing a thin protective layer between the solder composition and the freezing agent.

29. The method of claim 1, wherein the solder composition comprises a gallium alloy, and wherein the freezing agent comprises gold.

30. The method of claim 1, wherein the freezing agent is deposited on the hardened solder composition through vapor deposition.

31. A method for attaching an electronic component to a substrate, comprising the steps of:

proviging an electronic component and a substrate to be connected to each other across first and second surfaces with a liquid solder composition; and in any order, either simultaneously or consecutively (a) contacting the first and second surfaces with the liquid solder composition, and (b) contacting the liquid solder composition with a freezing agent;

wherein the liquid solder composition has a maximum melting temperature $T_{m1}$ of less than about 100° C. before it is exposed to the freezing agent, wherein the liquid solder composition interacts with the freezing agent to form a second composition which has a maximum melting temperature $T_{m2}$, wherein $T_{m2}-T_{m1}$ is at least about 25° C., and wherein the step of contacting the liquid solder composition with the freezing agent comprises the steps of (a) providing a solder composition in the form of a matrix of a first material that has particles of a second material disposed therein, wherein the first and second material are capable of interacting with each other in such a way that the first material solidifies, and wherein the particles of the second material are coated with a substance that serves to keep the first and second materials from reacting with each other below a first temperature $T_1$ and (b) reflowing the solder composition at a second temperature $T_2$, wherein $T_2$ is greater than $T_1$.

32. The method of claim 31, wherein the first material comprises gallium, and wherein the second material comprises sold.

* * * * *

UNITED STATES PATENT AND TRADEMARK OFFICE
CERTIFICATE OF CORRECTION

PATENT NO. : 6,740,544 B2
DATED : May 25, 2004
INVENTOR(S) : Strouse, Floyd et al.

It is certified that error appears in the above-identified patent and that said Letters Patent is hereby corrected as shown below:

Title page,
Item [57], ABSTRACT, please replace with the following:
-- A method for attaching a die (11) to a substrate (15) is provided. In accordance with the method, a die and a substrate are provided which are to be connected to each other across first and second surfaces. The first and second surfaces ae contacted with a liquid solder composition (21) having a maximum melting temperature [[$T_{mi}$]] $\underline{T}_{m1}$, of less than about 100 C. The liquid solder compostion is contacted with a freezing agent (17 or 19) such that a second composition is formed which has a maximum melting temperature $\underline{T}_{m2}$, wherein $\underline{T_{m2}\text{-}T_{m1}}$ is at least about 25º C.

Column 14,
Line 28, please delete Claim 4 and insert the following Amended Claim 4:
-- 4. The method of claim 3, wherein the freezing agent is also disposed on at least one of the first and second surfaces.

Column 16,
Line 25, please delete Claim 32 and insert the following Amended Claim 32:
-- 32. The method of claim 31, wherein the first material comprises a gallium, and wherein the second material comprises gold.

Signed and Sealed this

Twenty-first Day of December, 2004

JON W. DUDAS
*Director of the United States Patent and Trademark Office*